(12) United States Patent
Quaal et al.

(10) Patent No.: US 9,170,000 B2
(45) Date of Patent: *Oct. 27, 2015

(54) ANGLED EMITTER CHANNEL LETTER LIGHTING

(71) Applicant: The Sloan Company, Inc., Ventura, CA (US)

(72) Inventors: Bruce Quaal, Ventura, CA (US); Timothy Drew Ferrie, Ojai, CA (US); Aaron Meyer, Ventura, CA (US)

(73) Assignee: THE SLOAN COMPANY, INC., Ventura, CA (US)

( * ) Notice: Subject to any disclaimer, the term of this patent is extended or adjusted under 35 U.S.C. 154(b) by 221 days.

This patent is subject to a terminal disclaimer.

(21) Appl. No.: 13/653,282

(22) Filed: Oct. 16, 2012

(65) Prior Publication Data

US 2013/0039063 A1 Feb. 14, 2013

Related U.S. Application Data

(63) Continuation-in-part of application No. 13/010,703, filed on Jan. 20, 2011, which is a continuation-in-part of application No. 13/010,413, filed on Jan. 20, 2011, now abandoned, and a continuation-in-part of (Continued)

(51) Int. Cl.
*F21V 19/00* (2006.01)
*F21V 31/04* (2006.01)
(Continued)

(52) U.S. Cl.
CPC ............... *F21V 19/003* (2013.01); *F21S 4/001* (2013.01); *F21S 4/003* (2013.01); *F21V 15/01* (2013.01);
(Continued)

(58) Field of Classification Search
USPC ............... 362/249.02, 219.11, 800, 219, 222, 362/223, 225, 238, 240
See application file for complete search history.

(56) References Cited

U.S. PATENT DOCUMENTS 5,477,442 A 12/1995 Self
5,697,175 A 12/1997 Schwartz
(Continued)

FOREIGN PATENT DOCUMENTS

CN 101178164 5/2008
FR 2908500 5/2008

OTHER PUBLICATIONS

First Office Action from corresponding Chinese Appl. No. 201180011641.1, dated Apr. 23, 2014.
(Continued)

*Primary Examiner* — Laura Tso
(74) *Attorney, Agent, or Firm* — Koppel, Patrick, Heybl & Philpott

(57) ABSTRACT

The present embodiments provide channel letter lighting devices and/or systems. A lighting system, comprising a plurality of electrically connected lighting units, comprising conductors to provide an electrical signal to each of the units. Each of the lighting units comprise a housing, a printed circuit board (PCB) mounted within the housing and having a plurality of tabs and a plurality light emitting elements on the tabs. The tabs are angled in relation of the remainder of the PCB or housing. The electrical signal applied to the light emitting elements causes them to emit light substantially away from said housing. The lighting system further comprises a sealant within the housing filling cavities around the light emitting elements and the cavity around said PCB and a mounting mechanism for mounting the unit to a structure.

29 Claims, 8 Drawing Sheets

Related U.S. Application Data application No. 12/316,411, filed on Dec. 12, 2008, now abandoned.

(60) Provisional application No. 61/297,681, filed on Jan. 22, 2010, provisional application No. 61/425,713, filed on Dec. 21, 2010.

(51) Int. Cl.
| | |
|---|---|
| *F21S 4/00* | (2006.01) |
| *F21V 15/01* | (2006.01) |
| *F21V 21/08* | (2006.01) |
| *F21V 23/00* | (2015.01) |
| *G09F 13/04* | (2006.01) |
| *G09F 13/22* | (2006.01) |
| *H05K 1/02* | (2006.01) |
| *F21V 29/00* | (2015.01) |
| *H05K 1/05* | (2006.01) |
| *H05K 1/18* | (2006.01) |
| *F21Y 101/02* | (2006.01) |

(52) U.S. Cl.
CPC ............ *F21V 19/001* (2013.01); *F21V 21/0808* (2013.01); *F21V 23/005* (2013.01); *F21V 31/04* (2013.01); *G09F 13/0404* (2013.01); *G09F 13/22* (2013.01); *H05K 1/0278* (2013.01); *F21V 29/004* (2013.01); *F21Y 2101/02* (2013.01); *G09F 2013/222* (2013.01); *H05K 1/05* (2013.01); *H05K 1/189* (2013.01); *H05K 2201/046* (2013.01); *H05K 2201/09081* (2013.01); *H05K 2201/10106* (2013.01)

(56) References Cited

U.S. PATENT DOCUMENTS

| | | | |
|---|---|---|---|
| 5,847,336 A * | 12/1998 | Thornton | .................... 200/5 A |
| 6,042,248 A | 3/2000 | Hannah et al. | |
| 6,283,612 B1 | 9/2001 | Hunter | |
| 6,394,626 B1 | 5/2002 | McColloch | |
| 6,932,495 B2 | 8/2005 | Sloan et al. | |
| 7,063,440 B2 | 6/2006 | Mohacsi et al. | |
| 7,093,958 B2 * | 8/2006 | Coushaine | ............... 362/249.02 |
| 7,165,863 B1 | 1/2007 | Thomas et al. | |
| 7,241,031 B2 | 7/2007 | Sloan et al. | |
| 7,245,279 B2 | 7/2007 | Wang | |
| 7,887,218 B2 | 2/2011 | Wang | |
| 7,926,976 B2 | 4/2011 | Schinzel-Kolb et al. | |
| 2005/0231943 A1 | 10/2005 | Sloan et al. | |
| 2008/0310156 A1 | 12/2008 | Wang | |
| 2009/0226656 A1 | 9/2009 | Crandell et al. | |
| 2010/0124060 A1 * | 5/2010 | Wang | ....................... 362/249.06 |
| 2010/0135024 A1 | 6/2010 | Gier et al. | |
| 2012/0113606 A1 * | 5/2012 | Preuschl | ....................... 361/752 |
| 2012/0155088 A1 * | 6/2012 | Spaccasassi et al. | ..... 362/249.04 |
| 2012/0162989 A1 * | 6/2012 | Watanabe | ................ 362/249.02 |
| 2012/0250323 A1 * | 10/2012 | Velu | ......................... 362/249.02 |

OTHER PUBLICATIONS

GE Lighting Solutions. Tetra® Powerstrip and Powerstrip DS, technical data sheet and installation guide, 4 pages each.
US LED, Tandum2 brochure and specification. 11 pages.
"US LED: Tandem Cabinet Lighting, Tandem. Overview" http://www.usled.com/web10/products/cabinet/tandem/tandem.htm.
"Turnkey Plastic Injection Molding Services, Overmolding", Kamek Precision Tools, Inc., pp. 1-5. http://www.kamek.com/Overmolding/Default.aspx.
Tetra(tm) Mini Brings Bright Light to Small Signage Applications, GE Consumer Products, Aug. 18, 2010, pp. 1-4, http://pressroom.geconsumerproducts.com/pr/ge/06_tetramini.aspx.
Response to Office Action from U.S. Appl. No. 12/316,411, dated May 16, 2012.
Office Action from U.S. Appl. No. 12/316,411 dated Feb. 17, 2012.
Response to Office Action from U.S. Appl. No. 12/316,411 dated Dec. 19, 2011.
Office Action from U.S. Appl. No. 12/316,411 dated Sep. 19, 2011.
Response to Office Action from U.S. Appl. No. 1/316,411 dated Sep. 6, 2011.
Office Action from U.S. Appl. No. 12/316,411 dated Aug. 8, 2011.
LumiLEDS Red Super Flux LED Rail, Preliminary Technical Data Sheet. www.lumileds.com.
Third Office Action from Chinese Appl. No. 201180011641.1. dated Apr. 13. 2015.

* cited by examiner

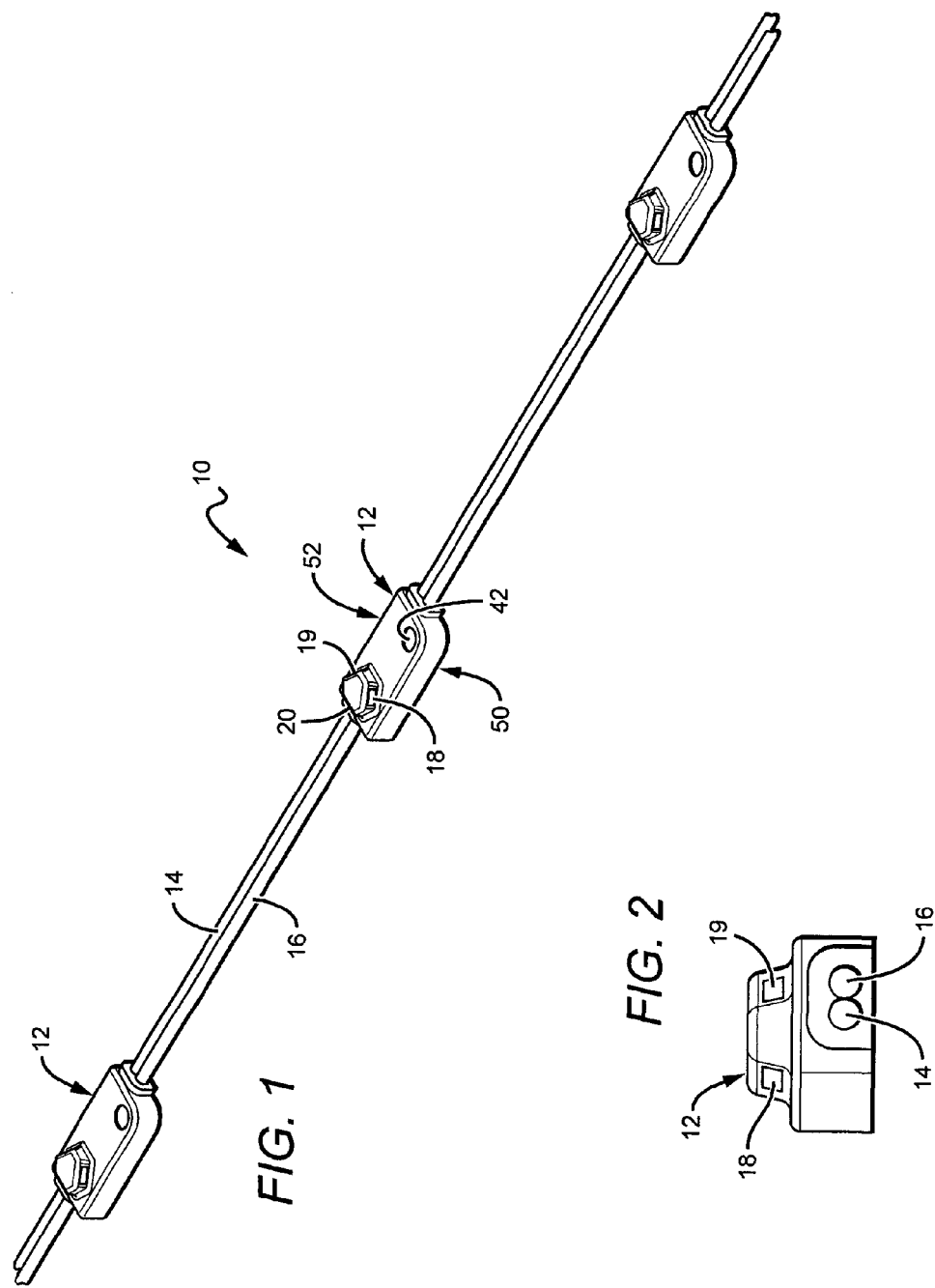

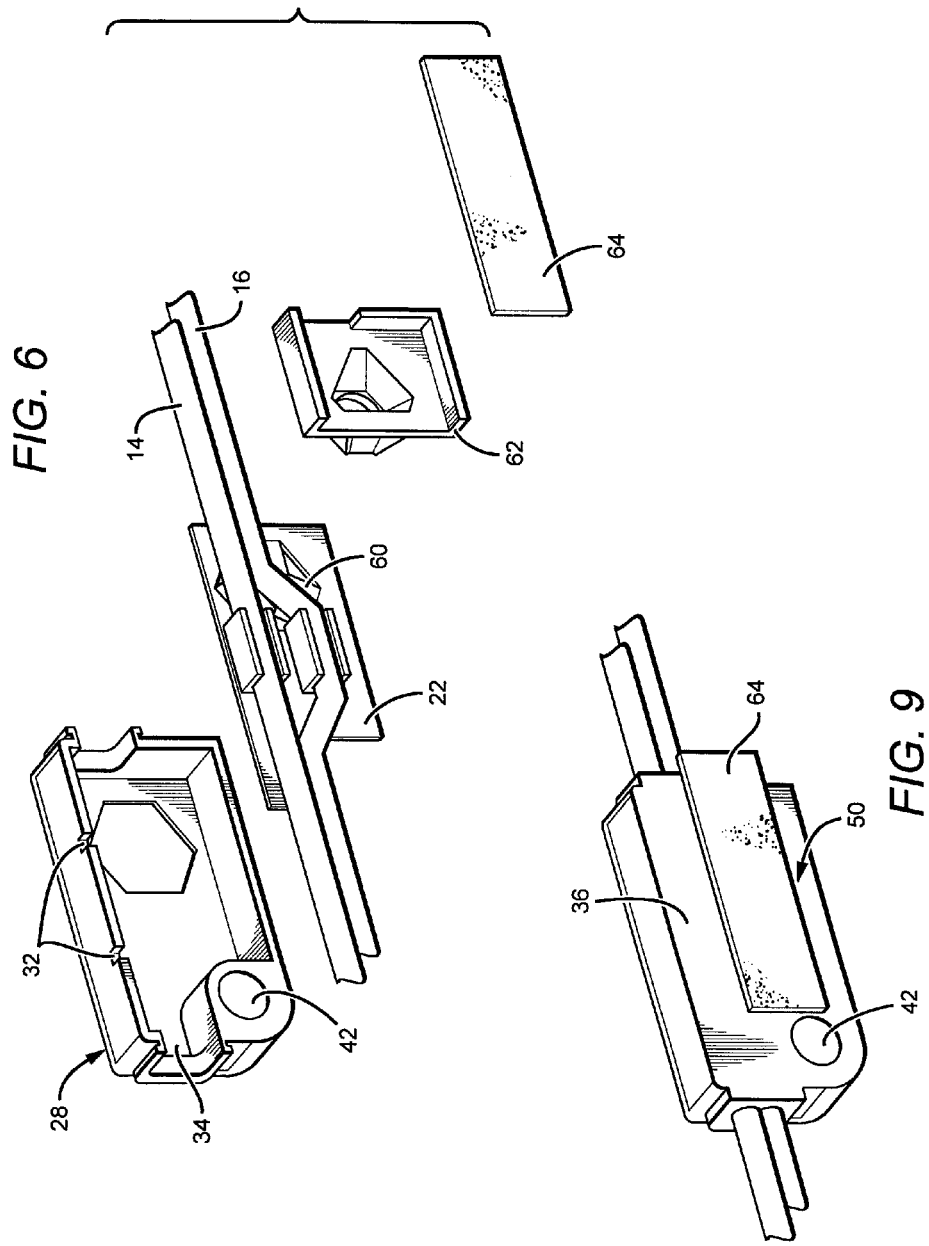

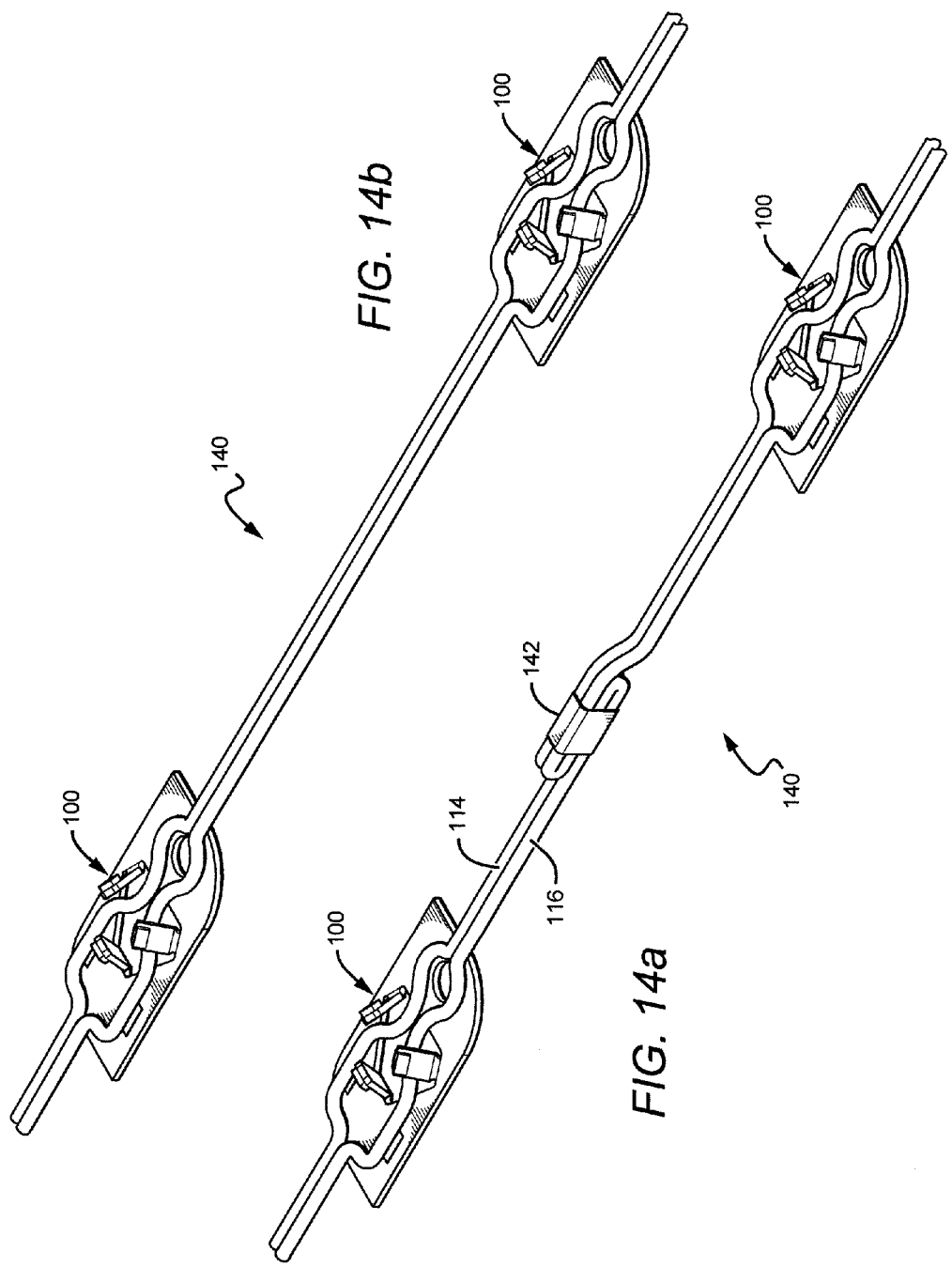

ANGLED EMITTER CHANNEL LETTER LIGHTING

This application is a continuation in part of Ser. No. 13/010,703 to Bruce Quaal et al., filed on Jan. 20, 2011, also a continuation in part of Ser. No. 13/010,413 to Bruce Quaal et al., filed on Jan. 20, 2011, also a continuation in part of Ser. No. 12/316,411 to Thomas C. Sloan, which was filed on Dec. 12, 2008, and also claims the benefit of provisional application Ser. No. 61/297,681 to Drew Ferrie filed on Jan. 22, 2010 and provisional application Ser. No. 61/425,713 to Drew Ferrie, which was filed on Dec. 21, 2010. The contents of Ser. Nos. 12/316,411, 13/010,413, 13/010,703, 61/425,713 and 61/297,681 are incorporated entirely herein by reference.

BACKGROUND OF THE INVENTION

1. Field of the Invention

This invention relates to lighting units using angled lighting for illuminating channel letters and more particularly to LED based lighting units for illuminating channel letters with angled or side emitting LEDs.

2. Description of the Related Art

Recent developments in LEDs have resulted in devices that are brighter, more efficient and more reliable. LEDs are rugged, consume less power, have a relatively long life (up to 100,000 hours), operate at low voltage, and are 30 to 70% more energy efficient than conventional lights, such as incandescent, neon or fluorescent bulbs. As a result of these developments, LEDs are becoming utilized in many more lighting applications that were previously the realm of incandescent, neon or fluorescent light sources.

Channel letters are commonly found on the outside of buildings and are often used to advertise the name of the business. They are typically constructed of aluminum or plastic housing having the shape of a letter and are approximately 2" to 5" deep. The housing has a generally U-shaped cross-section, with the top opening in the housing covered by a colored translucent lens that transmits light from within the housing.

Channel letters are typically illuminated with neon or fluorescent light sources that are mounted within the channel letter housing. Neon and fluorescent lights provide a bright and continuous light source that allows the channel letters to be visible at night. These light sources, however, have a relatively short life (20,000 hours), are fragile, operate at high voltage (7,000 to 15,000 volts for neon) and can consume a relatively large amount of power. Neon bulbs can also experience difficulty with cold starting, which can lead to the bulb's failure.

LEDs are more frequently being used as the light source in different sign applications. U.S. Pat. No. 5,697,175, to Schwartz, discloses a low power illuminated sign that is particularly adapted for use with common EXIT signs over doorways. The back of each sign comprises a reflector with a series of cavities with curved surfaces. Each cavity corresponds to a letter and background area in the sign. LEDs are mounted in the center of the cavities to illuminate the letters or background area. The LEDs are provided on a separate perpendicular circuit board or on a central projection formed in the bottom of the cavities, with light from the LEDs directed outward. The letters and background area of the sign are illuminated by light reflecting forward from the curved surfaces of the cavities, so that the only visible light is from the illumination of the cavities.

U.S. Pat. No. 6,042,248, to Hannah et al., discloses an LED assembly for channel letter illuminating signs having an enclosure/housing covered by a translucent lens. Each sign includes a plurality of track moldings at the base of its enclosure, with the moldings running along the longitudinal axis of the sections of the channel letter. Linear arrays of LEDs are mounted on printed circuit boards (PCBs) that are then mounted in the track moldings. Each track molding can hold two PCBs in parallel with each of the PCBs arranged on a longitudinal edge, with the LEDs directed outward.

LED based channel letter lighting is also available from LumiLEDs, Inc., under part numbers HLCR-KR-R0100 and HLCR-KR99-R0200, which comprises LEDs that are each mounted by insulation displacement connectors (IDC) on two inch centers. The chain of LED modules is then mounted into a bendable clip or rail, each of which is then mounted inside a channel letter to hold the LEDs in place. Power is provided by a combination of an AC/DC mother power supply and a DC/DC daughter power supply. A sensing LED is also included as a temperature and current sensor.

U.S. Pat. Nos. 6,932,495 and 7,241,031, both to Sloan et al., disclose channel letter lighting units and lighting systems utilizing the lighting units. In some embodiments these lighting units can be provided as multiple lighting units interconnected by conductors in a chain so that an electrical signal applied to the chain causes the lighting units to emit light. The chain can be made available to purchasers on different holding devices such as a box, reel or rack. Different lengths of the chain can be utilized for a particular channel letter, with the desired length of chain being cut from the holding device and mounted within the channel letter. Power can then be applied to the chain in the channel letter causing the units to emit light.

Different types of chains can have different numbers of lighting units per a length, or stated differently, a different density of lighting units. These chains are typically sold at a cost per measure of length, and the cost per length is typically greater for lighting systems having higher density. To accommodate the different needs of customers for chains of different densities, many different types of lighting system chains need to be maintained and stored and made available to customers. In some channel letter applications it may be desirable to have different densities of units in different locations. This can require purchasing multiple chains with different densities for the same job.

Each of the lighting units in the chain also has a certain number of LEDs, such as two, four, eight, sixteen, etc., depending on the embodiment. In certain circumstances it may be desirable to have fewer than all the number of LEDs provided on the units, such as in locations where the illumination should be spread. Conventional lighting units, however, offer little flexibility in reducing the number of LEDs in certain ones or all of the LED units in a chain.

Lighting units have been constructed by either placing the LEDs within a molded plastic housing or encasing the entire lighting unit within a sealant without a separate housing. The LEDs are flat or parallel in relation to the lighting unit and facing upwards or directly away from the mounting surface of a lighting unit. This creates a light dispersion pattern which has a higher intensity in the center or over the lighting unit but lower intensity at the sides. Dispersion of the light from these lighting units within the channel letter is important to provide the appearance of even lighting throughout the entire channel letter. An even dispersion serves to provide the appearance that the channel letter is itself lighting up rather than having separate light sources within. Some lighting units incorporate the use of reflectors or a lens over these LEDs to help disperse the light, however these may cause a loss of light output due to the lens or reflector.

SUMMARY OF THE INVENTION

The present invention provides channel letter devices, systems and methods of manufacturing same. A lighting system, comprising a plurality of electrically connected lighting units, comprising conductors to provide an electrical signal to each of said units. Each of the lighting units comprise a housing, a printed circuit board (PCB) mounted within the housing and having a plurality of tabs and a plurality light emitting elements on the tabs. The tabs are angled in relation of the remainder of the PCB or housing. The electrical signal applied to said light emitting elements causes them to emit light substantially away from said housing. The lighting system further comprises a sealant within the housing filling cavities around the light emitting elements and the cavity around said PCB and a mounting mechanism for mounting said unit to a structure.

Other embodiments provide a lighting unit, comprising a housing, a printed circuit board (PCB) mounted within the housing and having a plurality of tabs and having a plurality of light emitting elements on the tabs. These tabs and light emitting elements are angled in relation to the remainder of the PCB or the housing. An electrical signal applied to the light emitting elements causes them to emit light substantially away from said housing. The lighting unit further comprises a sealant within the housing, filling the cavity around the PCB and cavities around the light emitting elements.

In yet other embodiments, a lighting unit comprises a printed circuit board (PCB) having at least one tab and at least one light emitting element on the at least one tab. The at least one tab is adapted to be angled in relation to the PCB. An electrical signal applied to the at least one light emitting elements is arranged to cause the at least one light emitting element to emit light substantially away from the PCB.

Some further embodiments provide channel letter lighting systems. These embodiments can comprise a channel letter housing, a translucent channel letter cover, and a plurality of electrically connected lighting units mounted to said channel letter housing. Conductors provide an electrical signal to each of said units. Each of the units comprises a lighting unit housing and a printed circuit board (PCB) mounted within the lighting unit housing and having a plurality of tabs and the tabs having a plurality of light emitting elements. The tabs and the plurality of light emitting elements are angled in relation to the remainder of the PCB or housing. An electrical signal applied to the light emitting elements causes them to emit light substantially away from the housing. Furthermore, a sealant fills the surrounding area of the PCB within the housing. The sealant also fills all other cavities or voids within said housing without covering said light emitting elements.

Yet further embodiments provide a channel letter lighting system comprising a channel letter housing, a channel letter cover and an array of electrically connected lighting units mounted to the channel letter housing. Each of the lighting units comprise a printed circuit board (PCB) having at least one tab, wherein at least one light emitting element is on the at least one tab. The at least one tab is arranged such that it is angled in relation to the PCB. The lighting unit further comprises electrical conductors adapted to provide an electrical signal to the at least one light emitting element such that the at least one light emitting element emits light substantially away from the PCB and the channel letter housing.

A better understanding of the features and advantages of the present embodiments will be obtained by reference to the following detailed description of the invention and accompanying drawings which set forth illustrative embodiments in which the principles of the invention are utilized.

BRIEF DESCRIPTION OF THE DRAWINGS

FIG. 1 is a perspective view of one embodiment of a LED lighting unit system according to the invention;

FIG. 2 is a side view of a lighting unit shown in FIG. 1;

FIG. 6 is an exploded bottom view of one embodiment of a lighting unit in FIG. 1;

FIG. 9 is a bottom view of the lighting unit shown in FIG. 8;

FIG. 10b is a perspective view of the lighting unit shown in FIG. 10a;

FIG. 10c is a perspective view of the lighting unit shown in FIG. 10a;

FIG. 12b is a side view of the lighting unit shown in FIG. 12a;

FIG. 14a is a perspective view of another embodiment of a lighting system according to the invention;

FIG. 14b is a perspective view of the lighting system shown in FIG. 14a.

DETAILED DESCRIPTION OF THE INVENTION

Figure 3:
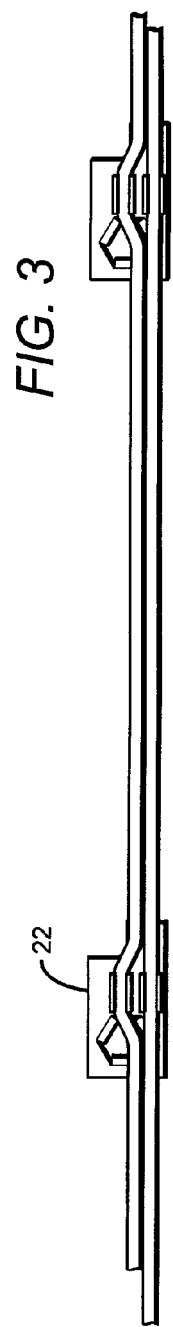
FIG. 3 is a bottom view of the lighting system shown in FIG. 1 with the housing and sealant removed.
Figure 4:
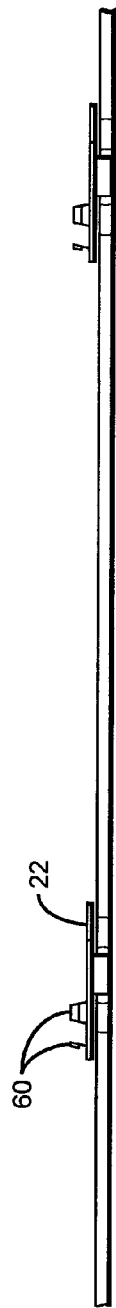
FIG. 4 is a side view of the lighting system shown in FIG. 1 with the housing and sealant removed

The present invention provides a lighting system that can be used in many different applications such as structural lighting, display lighting and ingress/egress lighting, but is particularly applicable to channel letter lighting. The systems according to the present invention provide lighting units that can be interconnected in a chain by electrical conductors so that an electrical signal applied to the input end of the conductors spreads to the lighting units, causing them to emit light. The lighting units can also be powered independently from other lighting units. According to the invention, the lighting units can be placed in a plastic housing; while in other embodiments of the invention the lighting units do not comprise a housing. The side of the lighting unit which can be mounted on a surface will be referred to as the bottom 50 of the lighting unit (shown in FIG. 1). The surface opposite the bottom will be referred to as the top 52. The LEDs are placed in the housing in such a manner that they are on the top of the lighting unit, but angled away from the top surface such that they are no longer parallel to the top surface and can emit at least a portion of their light to the sides of the lighting unit. The plastic housing of the lighting unit is then filled with a sealant, which allows for the lighting units to be customized to meet the particular application. For example, in channel letter applications there may be instances where weatherproofing or additional ruggedness may be desired, and the present invention allows for the sealing or additional ruggedness to be altered, by the use of different housing or filler materials, meeting these different needs.

These embodiments not only allow for the sealing of units to protect them from contaminants, but also allow for both the ability to style the face of the units, since a molded housing is used for the face. Also the units have an added rigidity or ruggedness provided because both a housing and a sealant are utilized.

In other embodiments of the lighting unit, the light emitting elements of the lighting unit are arranged on an angled surface, such that the angled surface can be adjusted to a desired angle. The lighting unit comprises at least one angled surface with at least one light emitting element on the at least one angled surface. The lighting unit can further comprise a plurality of angled surfaces wherein each angled surface comprises one or more light emitting elements. These lighting units can be customized to adjust and/or alter the emitted light distribution by adjusting the angle of the angled surface so as to meet a particular lighting solution.

The invention is described herein with reference to certain embodiments but it is understood that the invention can be embodied in many different forms and should not be construed as limited to the embodiments set forth herein. In particular, the invention is described with reference to certain embodiments where the lighting units or lighting unit sections are placed within a molded housing and filled with a sealant, but in other embodiments this process can be modified. In these embodiments, the PCB and lighting elements can be placed in the housing different methods. In addition, the lighting units may be filled and sealed using a variety of materials. However, in other embodiments, the lighting units are not within or covered by a housing. The invention can also be used with different types of lighting units used in different applications beyond channel letter lighting, and although the invention is described herein with reference to light emitting diodes (LED or LEDs) other light sources can be used.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to illustrations that are schematic illustrations of embodiments of the invention. As such, the actual thickness of the layers and features can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a feature of a device and are not intended to limit the scope of the invention.

FIGS. 1 and 2 show one embodiment of a lighting system 10 according to the invention that comprises a number of lighting units 12 daisy-chained together by first and second electrical conductors 14, 16. Each of the lighting units 12 has a number of light emitting elements 18, 19, 20 (described below) that illuminate out from the unit 12 in response to an electrical signal. The lighting units may have any number of light emitting elements 18, 19, 20 but 3 are shown in FIG. 1. The electrical conductors 14, 16 conduct electricity to the lighting units 12 and an electrical signal applied to the conductors 14, 16 at one end of the lighting system 10 is conducted to each of the lighting units 12 so that the light emitting elements 18, 19, 20 on each of the lighting units 12 simultaneously emit light. The lighting units 12 are particularly adapted to being mounted in channel letters, each of which has a transparent or translucent cover. With a translucent cover, when the light emitting elements 18, 19, 20 are illuminated in the channel letters, the light is diffused, by the features on the light emitting elements or the translucent cover, to give the appearance that the channel letters have a continuous light source.

In the figures the same reference numbers will be used herein for the same or similar features with the understanding that the description above applies to this embodiment, as well as the embodiments described below.

Figure 5:
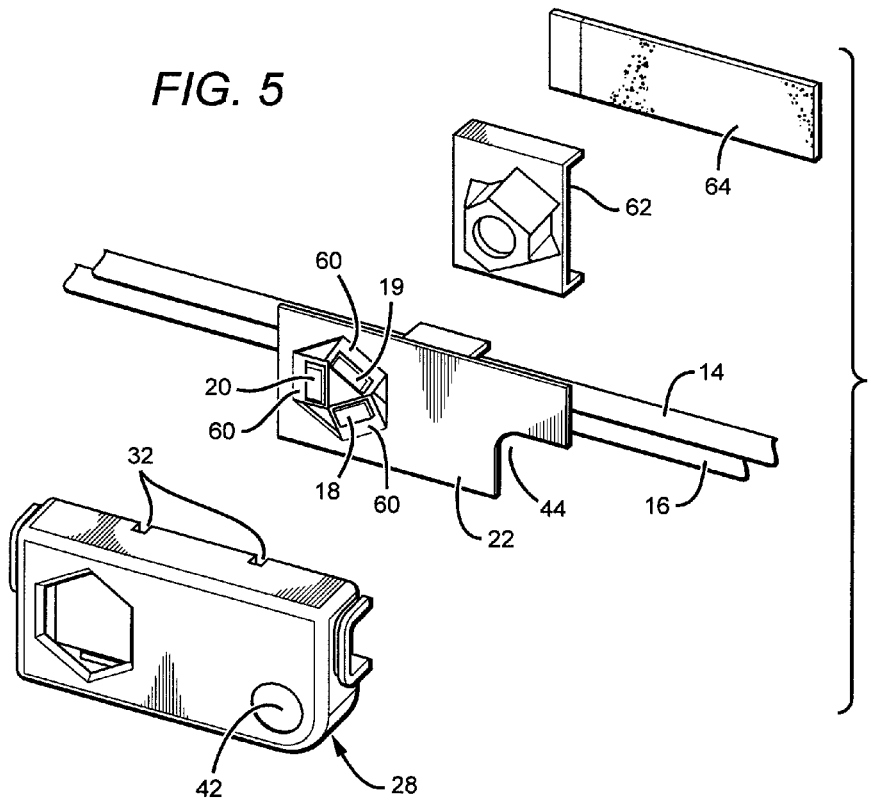
FIG. 5 is an exploded top view of one embodiment of a lighting unit in FIG. 1.

FIGS. 3 through 9 show the lighting system 10 in FIGS. 1 through 2 in more detail, with the lighting units and conductors 14, 16 shown from different angles. Each of the lighting units 12 comprises a printed circuit board (PCB) 22 mounted within a lighting unit housing 24. This PCB 22 can be made of flexible material, rigid material, or any other suitable PCB material. In embodiments where the PCB is made of a flexible material, the LEDs or lighting emitting elements 18, 19, 20 would be on flaps or tabs 60 of the PCB 22. In embodiments where the PCB 22 is made of a rigid material, additional wiring may be required from the tabs to the remainder of the PCB 22. Also, in embodiments where the PCB 22 is made of a rigid material, the tabs 60 are arranged such that they may be bent to accommodate the angled shaped plate or insert 62 (also called a housing plate). The tabs 60 may also be separate portions connected by suitable connection methods and wiring or soldering. As shown in FIG. 5, the housing 24 comprises a top housing portion 28 that the PCB 22 can be mounted into. The top housing portion 28 can be made of many conductive, semi-conductive and non-conductive materials, with a preferred material being plastic and can be made using many known processes such as by extrusion or injection molding. The housing 24 also comprises a shaped plate 62. The shaped plate 62 is inserted in the top housing portion 28 after the PCB 22 and it functions to force the tabs 60 of the PCB 22 up and through the opening in the top housing portion 28. The tabs 60 and lighting emitting elements 18, 19, 20 are then positioned outside the top of the top housing portion 28 and supported by plate 62.

The PCB 22 has first, second and third light emitting elements 18, 19 and 20 (shown in FIGS. 3, 4, 5) mounted to one side on the tabs 60, and conductors 14, 16 are mounted or connected to the PCB. Many different connection methods can be used, with one suitable method being soldering or with the use of IDC connectors or IPC connectors (Insulation Piercing Connectors). The conductors 14, 16 are shown to be mounted to the opposite side of the PCB 22 as light emitting elements 18, 19, 20, but can be mounted and connected on either side of the PCB 22. The conductors 14, 16 electrically couple the signal on the conductors 14, 16 to their respective one of the lighting units 12. The PCB 22 also comprises conductive traces (not shown) to conduct electrical signals from the conductors 14, 16 to the light emitting elements 18, 19, 20 so that an electrical signal applied to the first and second conductors 14, 16 is conducted to the light emitting elements 18, 19, 20 through the traces, causing the light emitting elements 18, 19, 20 to emit light.

The light emitting elements 18, 19, 20 are generally mounted such that the center of the group of light emitting elements 18, 19, 20 is along the longitudinal axis of the PCB 22, although they can also be mounted in other locations. In other embodiments the lighting units 12 can comprise more or less than three light emitting elements, such as four, six, and eight or more, that can be mounted in many different locations. The light emitting elements 18, 19, 20 can be any device that emits light in response to an electrical signal, such as incandescent lights, lasers, laser diodes, fluorescent light or neon lights, with exemplary light emitting elements 18, 19, 20 being light emitting diodes (LEDs). The light emitting elements 18, 19, 20 can emit different colors of different intensities, with a suitable LED comprising commercially available LEDs. One suitable LED would output 150 lumens per watt. In some embodiments, light elements may not have a lens, have lenses built in, or they may be added later.

The PCB 22 can be any conventional type made from any conventional material, with a preferred PCB 22 being a flexible type PCB. Different types of flexible boards can be used such as a board comprised of alternating layers of polyimide film and copper. By being a flexible material, tabs 60 may remain connected to the PCB 22 while capable of flexing in the direction plate 62 forces the tabs 60. Heat from the light emitting elements conducts into the PCB 22 so that the PCB 22 helps draw away heat from the light emitting elements 18, 19, 20. The PCB 22 then provides a larger surface area that allows the heat to dissipate into the surrounding ambient. This can help keep the light emitting elements 18, 19, 20 cooler, which can allow them to operate under a higher current so that they can emit a higher luminous flux. Also, the light emitting elements 18, 19, 20 may last longer if operating at a cooler temperature. In a PCB constructed of alternating layers of polyimide film and copper, the copper layers would allow for heat dissipation. Thermal vias, which connect the copper planes together, may be added around the light emitting elements 18, 19, 20 to allow for better, more efficient heat transfer.

Figure 7:
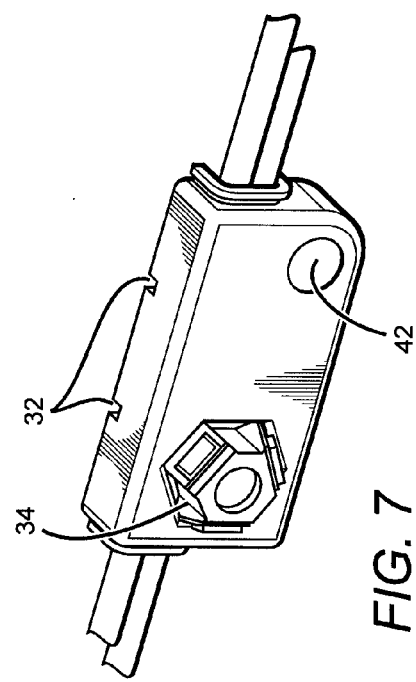
FIG. 7 is a perspective view of another embodiment of a lighting unit according to the invention before the sealant is applied.
Figure 8:
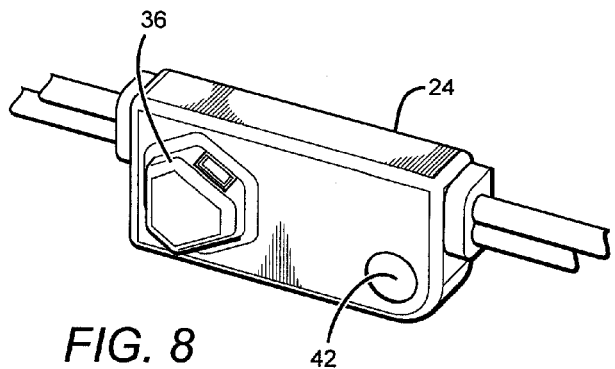
FIG. 8 is a perspective view of an embodiment of a lighting unit according to the invention after the sealant is applied.

As shown in FIG. 8, the light emitting elements 18, 19, 20 are angled so they do not face straight up from the top of the lighting unit. This angling is accomplished by housing plate 62 forcing the tabs 60 on the PCB 22 out of the top housing portion 28 and holding these tabs 60 at a desired angle, shown in FIGS. 5, 6, and 7. A thermal hotmelt or sealant is later added to keep these tabs 60 in place (described below). The light emitting elements are angled and arranged to disperse light evenly in a channel letter lighting unit. Channel letter lighting units have a variety of depths but they largely fall into the 2-5 inch range. Channel letter lighting units which will use LED lighting have a target depth of 2 inches.

The light emitting elements in the application are angled and positioned such that their light emissions overlap over the top of the lighting unit 12 to create an even light dispersion. The light emitting elements are angled by angling tabs 60 and tabs 60 are angled by the shaped plate 62. The angle of the tabs 60 directly impacts the angle of the light emitting elements. The light emitting elements generally have a higher output at the center of the light emitting element, but lower output to the sides of each light emitting element. When the light emitting elements are angled, the center and highest intensity output of each light emitting element is angled off center from the lighting unit itself. This direction of light output travels the furthest distance to the surface of the channel letter lighting unit to illuminate the channel letter lighting unit. Therefore providing a higher intensity output at these angles can provide more even light dispersion. The light dispersed directly over the lighting unit 12, is light dispersed at an angle for each of the light emitting elements 18, 19, 20, and at a lower intensity. Light emitted directly over the lighting unit travels the shortest distance to illuminate the channel letter lighting unit and therefore does not need to be as intense as light traveling to areas not directly over the lighting unit 12. Further, to accommodate for the lower intensity of light being emitting from the light elements 18, 19, 20 in this direction, the light outputs of the angled light elements 18, 19, 20 are overlapped in this area to create an even light dispersion.

In one embodiment using three light emitting elements, the light emitting elements would be angled at 60-75 degrees to provide this even light dispersion. In another embodiment, the light emitting elements would be angles at 45-85 degrees. In yet other embodiments other angle placements of the lighting emitting elements may be used. Preferably, the light emitting elements will not be placed at either 0 degree or 90 degree angles. The lighting unit 12 may have any number of light emitting elements and the number of light emitting elements and their distance from one another determines exemplary angles the light emitting elements should face for optimal channel letter lighting. For example, if the light emitting elements are further apart, a more decreased angle is desired. However, if the light emitting elements are closer together a steeper angle would be desired. Furthermore, an additional, possibly weaker or brighter, light emitting element may be placed on the surface between the other lighting emitting elements, on top of the dome created by housing plate 62, to aid in the creation of an even light dispersion. Additionally, the light emitting elements may include optics or lenses over said light elements.

Lighting units according to the invention can also comprise other elements, with one embodiment comprising heat sinks to dissipate heat from the light emitting elements. Another embodiment may comprise constant current devices (not shown) that can be mounted on the PCB using conventional methods. This allows each of the units to have substantially the same current driving its light emitting elements 18, 19, 20 so that each of the units 12 emits substantially the same amount of light. The light emitting elements 18, 19, 20, and constant current device can be interconnected by conductive traces on the PCB using conventional methods. Without a constant current device, the system 10 can experience light loss as the power signal passes down the conductors 14, 16 through each of the units 12. This can ultimately result in a channel letter exhibiting different brightness across its cover or by different channel letters in a sign having different brightness. By driving each of the light emitting elements 18, 19, 20 in each of the units 12 with the same current, the light emitting elements along the conductor will have the same brightness. Many different constant current devices 30 can be used, with a suitable device being an LM317M 3-Terminal Adjustable Regulator provided by Texas Instruments, National Semiconductor, and Fairchild Semiconductor.

In one embodiment, a PCB 22 with light emitting elements 18, 19, 20 and electrically connected conductors 14, 16 can be snapped into place inside a top housing portion 28 (as shown in FIGS. 5, 6 and 7), followed by housing plate 62. Next the cavities 34 left within the top housing portion around the plate 62, light emitting elements 18, 19, 20 and the PCB 22 are filled with a sealant, which bonds to the housing 28, PCB, and any other component the sealant contacts within the cavity (shown in FIG. 8). The sealant may be filled into the cavities from the side ports 32 of the top housing portion 28 and then allowed to cure fully. It must be ensured that there are no voids or air cavities and no sealant material is deposited on the light emitter or light emitter lenses. In order to cover the areas of the PCB 22 which are exposed outside of the top housing portion 28, around lighting emitting elements 18, 19, 20, during application of the sealant the lighting unit is placed within a mold. This mold has a cavity the shape of the desired dome or area around the lighting emitting elements 18, 19, 20. The mold also has posts inside which press against the lighting emitting elements 18, 19, 20 to prevent the sealant from flowing over the lighting emitting elements 18, 19, 20 or associated lenses over these light emitting elements. Covering this area of PCB 22 around the light emitting elements 18, 19, is also important to provide stability and rigidity for the placement of the light emitting elements 18, 19, 20. FIG. 7 shows the lighting unit before the sealant is added and FIG. 8 shows the lighting unit after the sealant 36 has been added. In some embodiments, this sealant may be a thermoplastic hotmelt which allows for sealing of the lighting unit from contaminants. For example, an embodiment of this lighting unit using a thermoplastic hotmelt as a filler and sealant could receive a large range of ingress protection ratings such as IP00 to IP68 or any other available rating. Some embodiments may have ingress protection ratings which are IP61 to IP68. Other embodiments may have a rating of IP68. When reading ingress protection ratings, the first digit indicates the level of protection that the enclosure provides against access to hazardous parts and the ingress of solid foreign objects. The second digit indicates the level of protection of the equipment inside the enclosure against harmful ingress of water. Generally the higher the number the better the protection. One suitable thermoplastic hotmelt is Macromelt© manufactured by Henkel AG & Co.

Bonding of the sealant 36 to components within the top housing portion 28 and filling of the cavities 34, also reduces strain on connections within the lighting unit such as strain on the emitter 18, 19, 20 connections and conductors 14, 16. The reduction of strain is a result of the sealant hardening around the components thereby reducing movement and supporting those connections.

Conventional lighting units utilizing only a plastic housing provides rigidity but not a weatherproof seal. Conventional lighting units utilizing only a sealant or thermoplastic hotmelt provides weatherproofing but does not produce as rigid of a product and the product face cannot be styled as that of one with a plastic housing. Utilizing both a top housing portion 28 and a sealant 36 such as macromelt can provide additional rigidity, weatherproofing, and a product face which can be stylized. This provides a product robust for installation and with a finished appearance.

Each lighting unit 12 can be mounted within a channel letter by many different methods such as by glue, clamp, bolt, weld, etc. Lighting unit 12 can be provided with double sided tape on its bottom surface 50 for mounting, as shown in FIG. 9. Many different double sided tapes 64 can be used, with an exemplary tape being a commercially available double sided foam tape provided by 3M Corporation. The lighting unit 12 can also be provided with an alternative mounting method that can be used alone or in conjunction with the double sided tape. The top housing portion 28 includes a housing mounting hole 42 through which a screw, nail or rivet can pass to mount the housing 24 (shown in FIG. 8). The PCB 22 also comprises a PCB mounting hole 44 in alignment with the housing mounting hole 42. Sealant 36 is applied in a manner, such as by blocking the area from sealant or any other suitable manner, which does not fill mounting hole 42 so that mounting hole 42 extends through the lighting unit. In one embodiment according to the present invention a screw can pass through the PCB mounting hole 44 and into the top housing portion mounting hole 42. A screwdriver can then pass through the PCB mounting hole 44 to turn the screw into the channel letter, through the top housing portion 28 mounting hole 42.

Figure 10A:
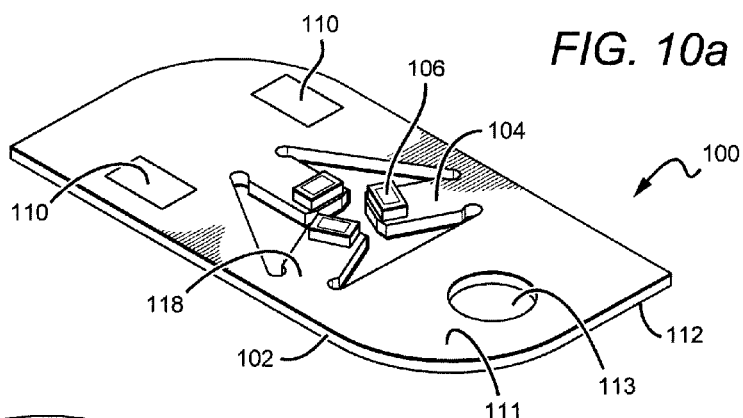
FIG. 10a is a perspective view of another embodiment of a lighting unit according to the invention.
Figure 10B:
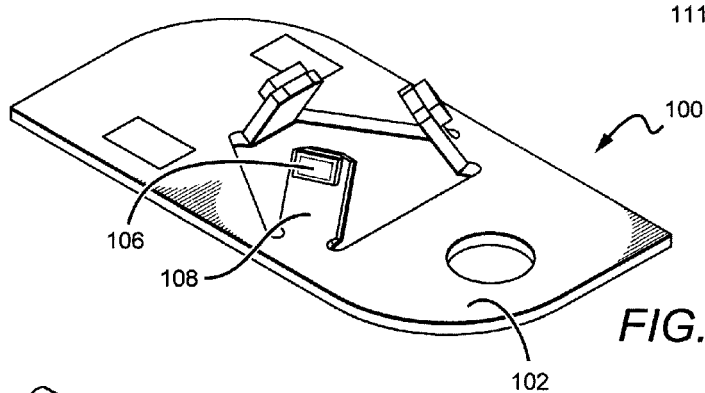
Figure 10C:
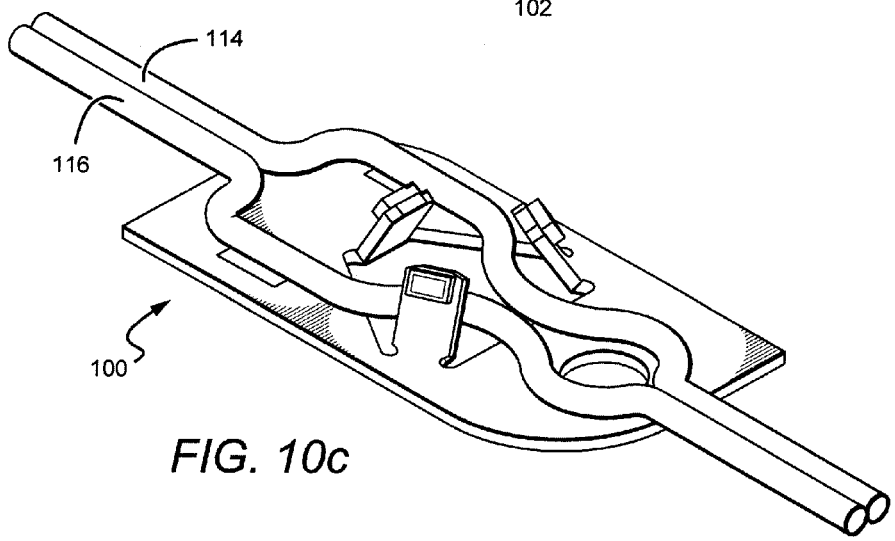

In another embodiment of the invention, as shown in FIGS. 10*a*-10*c*, a lighting unit 100 comprises a PCB 102 having at least one tab 104 and at least one light emitting element 106 on the at least one tab 104. The at least one tab 104 is adapted to be angled in relation to the PCB 102 such that the at least one light emitting element 106 is on an angled surface 108. The lighting unit 100 further comprises electrical conductors 114, 116 adapted to provide an electrical signal to the at least one light emitting element 106 to cause the at least one light emitting element 106 to emit light substantially away from the PCB 102.

The PCB 102 comprises a top surface 111, a bottom surface 112 and a slot 113, wherein the at least one light emitting element 106 is on the top surface 111 of the PCB 102. The PCB 102 further comprises contact pads 110 on the top surface 111 that are arranged to receive the electrical conductors 114, 116. The electrical conductors 114, 116 are received by a respective contact pad 110 so that the electrical conductors 114, 116 are in electrical contact with the at least one light emitting element 106. In some embodiments, the electrical conductors 114, 116 can be soldered to the respective contact pad 110. However, in other embodiments, the electrical conductors 114, 116 can be electrically connected to the contact pad 110 by using an Insulation Piercing Connector (IPC) or an Insulation Displacement Connector (IDC). The PCB 102 also comprises trace elements (not shown) between the contact pads 110 and the at least one light emitting element 106 to allow the electrical signal to be provided to the at least one light emitting element 106.

The PCB 102 can be made of many different materials, such as but not limited to, flexible materials, rigid materials, or any other suitable PCB material. The tabs 104 are arranged such that they are flexible and can be bent to form the angled surface 108 without causing damage to the PCB 102, and are able to retain the shape of the angled surface 108. As shown in FIGS. 10*a*-10*c*, the tabs 104 are bent about a joint 118, wherein the joint 118 connects the tabs 104 to the PCB 102. In other embodiments, the angle of the angled surface 108 may be maintained by placing a supportive structure (not shown) adjacent or proximate the tab 104 in order to ensure that the angle of the angled surface 108 is not changed due to gravity and/or other external influences. In the embodiment shown in FIGS. 10*a*-10*c*, the PCB 102 comprises three tabs 104 in a triangular-like configuration, but the configuration of the tabs 104 is not intended to be limited to a triangular configuration. In other embodiments, the PCB 102 can comprise one or more tabs 104 and these tabs 104 can be configured in many different configurations, such as but not limited to circular, linear, square or any other configuration.

In some embodiments, the lighting unit 100 can have more than one light emitting element 106. For example, as shown in FIGS. 10*a*-10*c*, each tab 104 can have one light emitting element 106. In other embodiments, each tab 104 can have one or more light emitting elements 106. In yet other embodiments, the tabs 104 can have an equal amount of light emitting elements 106 on each respective tab 104. While in other embodiments, the tabs 104 can have a different amount of light emitting elements 106 on each respective tab 104. The tabs 104 may also be separate portions connected to the PCB 102 at the joint 118 by suitable connection methods and wiring or soldering.

Figure 11A:
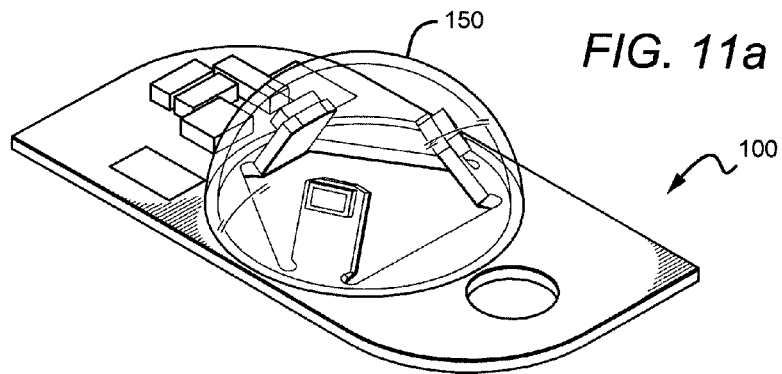
FIG. 11a is a perspective view of another embodiment of a lighting unit according to the invention.
Figure 11B:
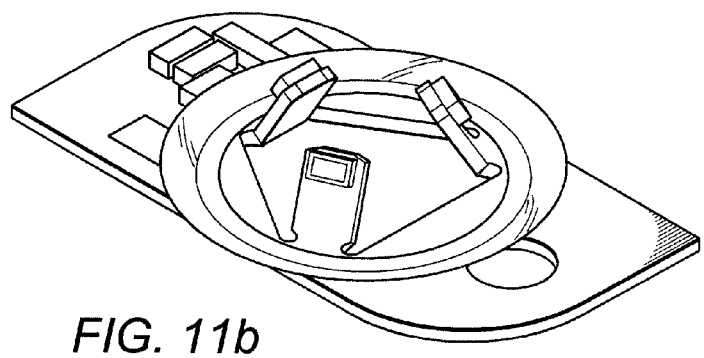
FIG. 11b is a perspective view of another embodiment of a lighting unit according to the invention.

The at least one light emitting element 106 can be any device that emits light in response to an electrical signal, such as incandescent lights, lasers, laser diodes, fluorescent light, neon lights or light emitting diodes (LED). For embodiments comprising more than one light emitting element 106, the light emitting elements 106 can emit different colors of different intensities, with a suitable LED comprising commercially available LEDs. In some embodiments, as shown in FIGS. 11a and 11b, the lighting unit 100 can comprise an optical element 150 on the PCB 102 and proximate the at least one light emitting element 106, such that the light emitted from the at least one light emitting element 106 is altered and/or dispersed due to the features of the optical element. In some embodiments, the optical element 150 is over and covering the at least one light emitting element 106, while in other embodiments, the optical element 150 surrounds the at least one light emitting element 106. The optical element 150 can be a reflector to reflect light in a certain direction, a lens to concentrate or alter the emitted light, or a diffuser to diffuse the light emitted from the at least one light emitting element 106, or a combination thereof. The optical element 150 can be mounted on the PCB 102 using various different methods, such as but not limited to being glued onto the PCB 102, mechanically fastened to the PCB 102, overmolded onto the PCB 102, or slidably mounted onto the PCB 102. This is a non-exhaustive list of examples of how the optical element can be mounted on the PCB 102, and are not intended to be limited to the examples disclosed herein. The optical element 150 can be mounted on the PCB 102 when the lighting unit 100 is fabricated or it can be mounted at any time after fabrication of the lighting unit 100.

As discussed above, the PCB 102 can be any conventional type made from any conventional material, such as a flexible type PCB 102. Different types of flexible boards can be used such as a board comprised of alternating layers of polyimide film and copper. By being a flexible material, the at least one tab 104 may remain connected to the PCB 102 while being capable of flexing in a direction substantially orthogonal to the PCB 102. The PCB 102 is further configured such that heat from the at least one light emitting element 106 conducts into the PCB 102 so that the PCB 102 helps draw away heat from the at least one light emitting element 106. The PCB 102 provides a larger surface area that allows the heat to dissipate into the surrounding ambient. This can help keep the at least one light emitting element 106 cooler, which can allow it to operate under a higher current so that it can emit a higher luminous flux. Also, the at least one light emitting element 106 may last longer if operating at a cooler temperature. In embodiments of the lighting unit comprising a PCB 102 constructed of alternating layers of polyimide film and copper, the copper layers would allow for heat dissipation. Thermal vias, which connect the copper planes together, may be added proximate the at least one light emitting element 106 to allow for better, more efficient heat transfer.

The at least one light emitting element 106, as shown in FIGS. 10b and 10c, is angled such that the at least one light emitting element 106 is not facing a direction perpendicular to the PCB 102. However, in some embodiments, the at least one light emitting element 106 can face a direction perpendicular to the PCB 102, such that the angled surface 108 is set at an angle of 0 degrees with respect to the PCB 102. The angled surface 108 can be set at any time before or after installation of the lighting unit 100. The at least one light emitting element 106 is angled and arranged to emit light evenly, and can be installed in a channel letter. Channel letters have a variety of depths, with a typical depth within the range of 2-5 inches. In embodiments having more than one light emitting element 106, the light emitting elements 106 are angled such that the emitted light from each light emitting element 106 overlaps over the top of the lighting unit 100 to create an even light distribution. In other embodiments, the light emitting elements 106 can be angled such that the emitted light does not overlap. The angle of the angled surface 108 determines the overall light distribution of the lighting unit 100. In some instances different applications would require different lighting needs and having angled surfaces 108 that are set at different angles that will provide a desired light distribution that could not be provided if all the angled surfaces were set at the same angle for a given channel letter housing, for example, a non-standard shaped channel letters, such as but not limited to a cloud box, or when space limitations do not allow the lighting unit to be mounted in a location to allow even light emission.

The angle of the at least one tab 104 can be set at various different angles to form the angled surface 108, based on the desired light distribution for a lighting application. For example, in some embodiments the at least one tab 104 can be set at an angle within the range of 60-75 degrees to provide an even light distribution. While in other embodiments, the at least one tab 104 can be set at an angle within the range of 45-85 degrees. In yet other embodiments, the angle of the angled surface 108 can be within the range of 0-90 degrees. As stated above, embodiments comprising more than one tab 104 can have the angled surface set at different settings and can be within the ranges disclosed herein. The lighting unit 100 may have any number of light emitting elements 106 and the number of light emitting elements 106 and their distance from one another determines the angles of the angled surfaces 108 upon which the light emitting elements 106 should face for optimal channel letter lighting. For example if the light emitting elements 106 are further apart, the angled surface 108 should be set at a more decreased angle is desired, whereas, if the light emitting elements 108 are closer together the angled surface 108 should be set at a steeper angle.

The lighting unit 100 can also comprise other elements, with one embodiment comprising heat sinks to dissipate heat from the light emitting elements 106. Other embodiments may comprise constant current devices (not shown) that can be mounted on the PCB 102 using conventional methods. This allows the lighting unit 100 to have substantially the same current driving the light emitting elements 106 such that each of the light emitting elements 106 emits substantially the same amount of light. The light emitting elements 106 and constant current device can be interconnected by conductive traces on the PCB 102 using conventional methods. Without a constant current device, the lighting unit 100 can experience light loss as the electrical signal passes through the conductors 114, 116 through each of the light emitting elements 106. This can ultimately result in the lighting unit 100 exhibiting different brightness across its light emission pattern. By driving each of the light emitting elements 106 in each of the lighting units 100 with the same current, the light emitting elements 106 within the lighting unit 100 will emit light at substantially the same brightness. In yet other embodiments, the lighting unit 100 can further comprise a transparent coating that covers all the components of the lighting unit 100. The transparent coating can be a conformal coating that provides a protective coating over the elements on the front and/or back surface of the PCB 102. The transparent coating can be made of a transparent resin, epoxy or the like. The transparent coating can be made of many different materials and is not intended to be limited to the embodiments presented herein.

The lighting unit 100 is particularly adapted to being mounted in channel letters which can have a transparent or translucent cover, to form a lighting system 140. The lighting system 140 comprises at least one lighting unit 100 mounted in a channel letter (not shown). The lighting system 140 can also comprise a plurality of lighting units 100 connected in a daisy-chain configuration using the electrical conductors 114, 116. The slot 113 of the lighting unit 100 is adapted to receive a mounting device such as, but not limited to, a screw, nail, rivet or the like so as to extend through the slot 113 and mount the lighting unit 100 to the channel letter. The lighting unit 100 can be mounted in a variety of ways and is not intended to be limited to the examples disclosed herein. In other embodiments, the lighting unit 100 can be mounted onto a carrier or bracket (not shown) instead of being mounted onto a surface of the channel letter. The carrier or bracket can also be used in embodiments wherein the lighting unit is configured to be a double-sided lighting unit (discussed below). The carrier allows the double-sided lighting unit to be mounted away from the surfaces of the channel letter to allow the double-sided lighting unit to emit light towards both the front and back of the channel letter. For channel letters with a translucent cover, when the at least one light emitting element 106 is illuminated in the channel letter the light can be diffused by the features on or adjacent the light emitting element 106 or the translucent cover of the channel letter, in order to give the appearance that the channel letter has a continuous light source.

The spacing between adjacent lighting units 100 within the lighting system 140 can be altered to modify the density of lighting units 100 or light emitting elements 106 in a chain of lighting units 100. Altering the density of lighting units can alter the overall light distribution pattern of the lighting system 140. The density can be decreased by increasing the length of the electrical conductors 114, 116 between adjacent lighting units 100. As shown in FIG. 14a, the lighting system 140 comprises a plurality of lighting units 100 in a daisy-chain configuration, wherein the electrical conductors 114, 116 connect a lighting unit 100 to an adjacent lighting unit 100. The electrical conductors 114, 116 in the region between adjacent lighting units 100 are arranged in a coiled or serpentine manner to provide an additional amount of electrical conductors 114, 116. The additional amount of electrical conductors 114, 116 can be arranged in many different configurations and is not intended to be limited to a coiled or serpentine manner. The additional amount can be wrapped around a physical feature, such as a breakable pin or the like, extending from the channel letter or other structure upon which the lighting unit 100 is mounted. The additional amount of electrical conductors 114, 116 is wrapped using a clamping device 142, such as but not limited to a clip, clamp, bracket, rubber band, or the like. In other embodiments, the clamping device 142 can be overmolded onto the electrical conductors 114, 116 using known molding processes.

To increase the length between adjacent lighting units 100 of the lighting system 140, a pulling force is applied that is sufficient to overcome the holding force between the electrical conductors 114, 116 and the clamping device 142. This results in the additional section being released from the clamping device 142 thereby increasing the length between adjacent lighting units 100, as shown in FIG. 14b. An advantage of the invention is that extending the length of the electrical conductors between adjacent lighting units 100 provides flexibility in adjusting the lengths between adjacent units as well as flexibility in the lighting unit density. Another advantage of the invention is that the additional amount of electrical conductors 114, 116 can be cut to separate adjacent lighting units 100, or can be configured to allow another device to be electrically connected to the lighting units 100, such as but not limited to an external power supply or controller.

The embodiments of the lighting unit 100 shown in FIGS. 10a-11 disclose a singled-sided lighting unit. However, in other embodiments of the invention, a lighting unit 200 is arranged to be a double-sided lighting unit. The lighting unit 200, shown in FIGS. 12a and 12b, is similarly configured to the lighting unit 100, but is further arranged such that at least one tab 106 can be bent in a direction that is substantially orthogonal to the bottom surface 112 of the PCB 102.

The lighting unit 200 comprises a PCB 102, at least one tab 104, and at least one light emitting element 106 on the at least one tab 104. The PCB 102 further comprises a top surface 111, a bottom surface 112 and a slot 113, wherein at least one light emitting element 106 is on the top surface 111 and the bottom surface 112. The at least one tab 104 is adapted to be angled in relation to either of a top or bottom surface 111, 112 of the PCB 102 such that the at least one light emitting element 106 is on an angled surface 108. As shown in FIGS. 12a and 12b, the at least one tab 104 is adapted to be bent to form an angled surface 108 with respect to the bottom surface 112 of the PCB 102, while the other tabs 104 are adapted to be bent to form an angled surface 108 with respect to the top surface 111 of the PCB 102. The tabs 104 are adapted to be bent in a similar fashion and within a similar range as the tabs of lighting unit 100, discussed above. Bending the tabs 104 with respect to the top and bottom surfaces 111, 112 of the PCB 102 allows the light emitting elements 106 to emit light substantially away from both the top and bottom surfaces 111, 112 of the PCB 102, thereby forming the double-sided lighting unit 200. An advantage of the invention is that the lighting unit 200 can be mounted in channel letters that have a transparent or translucent cover on a front and back surface, such that the light emitted from the light emitting elements 106 illuminates both the front and back surface of the channel letter. Furthermore, the angle of the at least one tab 104 can be adjusted at any time before or after installation which allows the light distribution to be adjusted to accommodate for any lighting application. The lighting unit 200 allows for only one lighting unit to be used to provide illumination to the front and back surfaces of the channel letter, which can be advantageous for lighting applications where space is limited and/or cannot allow for multiple lighting units to be used.

Figure 12A:
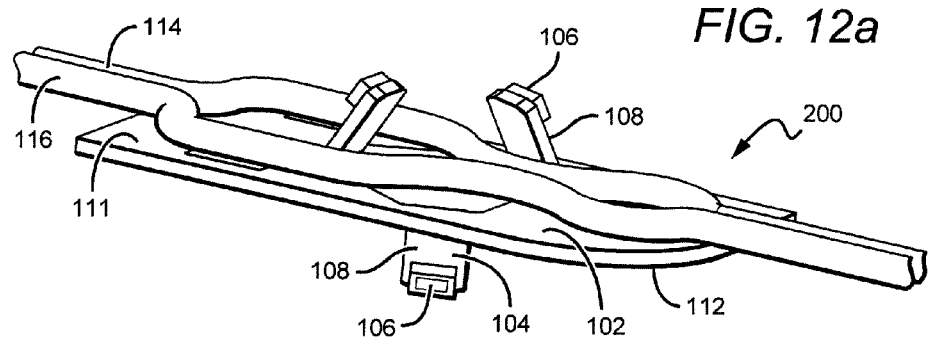
FIG. 12a is a perspective view of another embodiment of a lighting unit according to the invention.
Figure 12B:
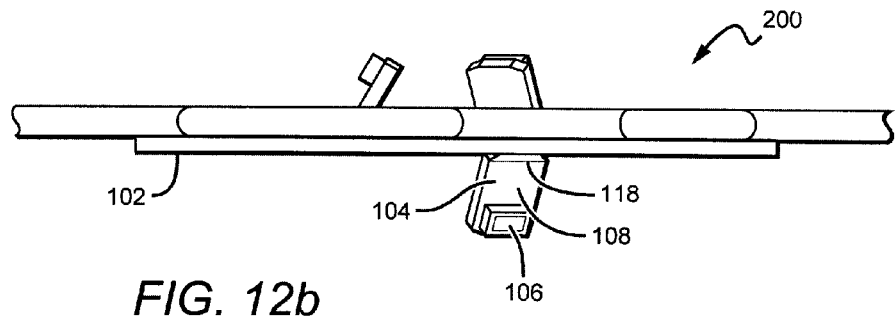

FIGS. 12a and 12b show that only one tab 104 is bent to form an angled surface 108 with respect to the bottom surface 112 of the PCB 102. However, in other embodiments, more than one tab 104 can be bent to form an angled surface 108 with respect bottom surface 112. In yet other embodiments, the lighting unit 200 can be configured such that a plurality of tabs 104 are bent to form an angled surface 108 with respect to the top surface 111 and a plurality of tabs 104 are bent to form an angled surface 108 with respect to the bottom surface 112 of the PCB 102. The lighting unit 200 further comprises electrical conductors 114, 116 adapted to provide an electrical signal to the at least one light emitting element 106 to cause the at least one light emitting element 106 to emit light in response to the electrical signal. The lighting unit 200 can also comprise an optical element 150, similarly configured as in the lighting unit 100.

Figure 13A:
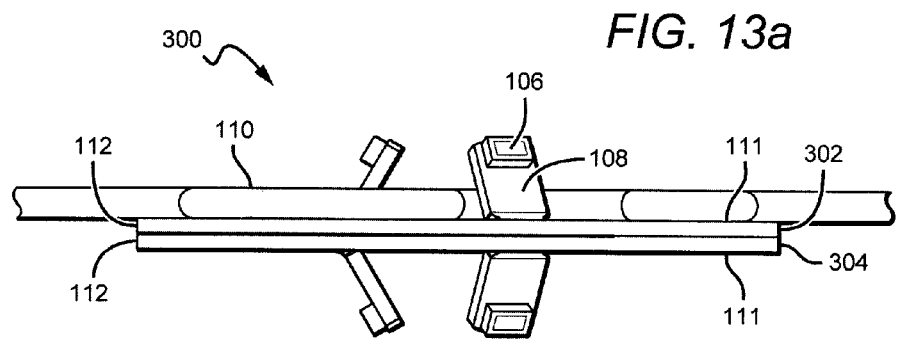
FIG. 13a is a side view of another embodiment of a lighting unit according to the invention.

FIG. 13a discloses another embodiment of the invention wherein a lighting unit 300 is also configured to be a double-sided lighting unit. The lighting unit 300 is comprised of a first PCB 302 and a second PCB 304 arranged in a back-to-back configuration, wherein each of the first and second PCBs 302, 304 comprise at least one tab 104 arranged to be bent to form an angled surface 108 with respect to the top surface 111 of its respective PCB 302, 304. The first and second PCBs 302, 304 of lighting unit 300 are similarly configured as the PCB 102 of lighting unit 100. The lighting unit 300 further comprises a contact pad 110 which is arranged to receive the electrical conductors 114, 116. The first and second PCBs 302, 304 of the lighting unit 300 are electrically connected such that the electrical signal provided by the electrical conductors 114, 116 is provided to the light emitting elements 106 on both of the first and second PCBs 302, 304. The lighting unit 300 can also comprise an optical element 150 on the first and/or second PCB 302, 304, similarly configured as in the lighting unit 100.

Figure 13B:
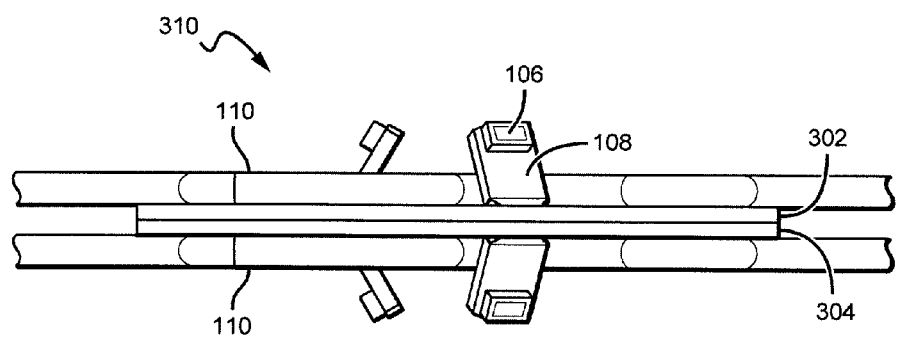
FIG. 13b is a side view of another embodiment of a lighting unit according to the invention.

In other embodiments, as shown in FIG. 13b, a lighting unit 310 is configured similarly as the lighting unit 300, but the first and second PCBs 302, 304 of lighting unit 310 are electrically isolated from each other. The first and second PCBs 302, 304 are arranged to receive an independent electrical signal such that a set of electrical conductors 114, 116 are connected to each of the PCBs 302, 304. An advantage of this configuration is that the light emitting elements 106 of the respective PCBs 302, 304 can be independently controlled by a separate electrical signal that can provide different power levels to the light emitting elements 106 to adjust and/or alter the overall light distribution or desired lighting effect of the lighting unit 310. For example, the at least one light emitting element 106 on the first PCB 302 can be arranged to emit at a higher, lower or similar luminous flux than the at least one light emitting element 106 on the second PCB 304, and vice versa. The lighting unit 310 can also comprise an optical element 150 on the first and/or second PCB 302, 304, similarly configured as in the lighting unit 100.

At least one distinction between the lighting units 100, 200, 300 and 310 and that of the lighting unit 12, discussed above and shown in FIGS. 1-9, is that the lighting units 100, 200, 300 and 310 do not comprise a housing. The PCBs 102, 302, 304 of lighting unit 100, 200, 300 and 310 are not mounted within or covered by a housing, whereas the PCB 22 of the lighting unit 12 is mounted within the housing 24. At least one advantage of the invention is that the at least one tab 104 of the lighting units 100, 200, 300 and 310 are configured such that the angle of the at least one tab 104 can be set and or adjusted at any time. For instance, the angle of the at least one tab 104 can be set at any time prior to or after the lighting units 100, 200, 300 and 310 have been installed at its final destination. In other instances, the angle of the at least one tab 104 can be adjusted to a different angle in order to modify or alter the lighting characteristics of the lighting unit 100, 200, 300 and 310. Yet another distinction between the lighting units 200, 300 and 310 and that of lighting unit 12 is that lighting units 200, 300 and 310 are configured to be double-sided lighting units, whereas lighting unit 12 is a single-sided lighting unit. The lighting units 200, 300 and 310 are mounted onto a carrier or similar structure, wherein the carrier is then mounted within the channel letter to allow the lighting units 200, 300 and 310 to emit light towards a front and back surface of the channel letter. The electrical conductors 114, 116 of lighting units 200, 300 and 310 can also be wrapped in a clamping device 142 as discussed above.

Although the invention has been described in considerable detail with reference to certain embodiments thereof, other versions are possible. Lighting units according to the invention can be used for many different applications beyond channel letters. A separate power supply can be used for each channel letter or multiple letters can be powered by a single power supply. In other embodiments, a variable power supply can be used to control the intensity of the light emitting elements. The lighting unit can be many different sizes and can be used in many different applications beyond channel letters. The PCB can have different numbers of LEDs and can have different electronic components arranged in different ways. The conductors can be different lengths and instead of running uninterrupted between the units, the conductors can have connectors. This would allow the units to be supplied separately and then connected together when installed. Therefore, the spirit and scope of the invention and should not be limited to the preferred versions described above.

We claim:

1. A lighting unit, comprising:
   a printed circuit board (PCB) comprising a front surface, a back surface and at least one tab;
   at least one light emitting element on said PCB;
   said at least one tab adapted to be bent in a direction away from said PCB to form an angled surface with respect to the PCB, wherein said at least one light emitting element is on said angled surface; and
   conductors electrically connected with said PCB to provide an electrical signal to said at least one light emitting element, wherein said at least one light emitting element emits light away from said PCB such that said lighting unit is configured to emit light in a substantially omni-directional pattern.

2. The lighting unit of claim 1, wherein said PCB comprises a metal core PCB arranged to conduct heat away from said at least one light emitting element.

3. The lighting unit of claim 1, wherein said PCB comprises alternating layers of polymide film and copper.

4. The lighting unit of claim 3, wherein said PCB further comprises vias arranged proximate said at least one light emitting element to assist in heat dissipation.

5. The lighting unit of claim 1, wherein said PCB is capable of conducting and dissipating heat from said at least one light emitting element.

6. The lighting unit of claim 1, wherein said PCB comprises a plurality of tabs and a plurality of light emitting elements, wherein each of said plurality of tabs comprises at least one of said plurality of light emitting elements.

7. The lighting unit of claim 1, wherein said at least one tab is configured to be bent about a joint in order to form said angled surface, said joint disposed between said at least one tab and said PCB.

8. The lighting unit of claim 1, wherein said at least one tab is adapted to be set at an angle within the range of 0-90 degrees with respect to said PCB.

9. The lighting unit of claim 6, wherein said plurality of tabs are bent such that said angled surfaces are angled within the range of 0-90 degrees with respect to said PCB.

10. The lighting unit of claim 9, wherein each of said angled surfaces are set at the same angle with respect to said PCB.

11. The lighting unit of claim 9, wherein at least one of said angled surfaces is set at a different angle with respect to said PCB and the other of said angled surfaces.

12. The lighting unit of claim 1, wherein said angled surface is adapted to be adjusted at any time prior to or after installation of the lighting unit.

13. The lighting unit of claim 1, said PCB further comprising a slot adapted to receive a mounting device to allow said lighting unit to be mounted onto a surface or other structure.

14. The lighting unit of claim 1, further comprising an optical element on said PCB and proximate said at least one light emitting element to alter the light emitted from the at least one light emitting element.

15. The lighting unit of claim 14, wherein said optical element comprises at least one of a lens, diffuser, reflector, or a combination thereof.

16. A lighting unit, comprising:
   at least one printed circuit board (PCB) comprising a front surface, a back surface and at least one tab;
   at least one light emitting element on said front surface and said back surface of said PCB;
   wherein a first tab is adapted to be bent in a direction away from said front surface of said PCB to form an angled surface with respect to said front surface and a second tab adapted to be bent in a direction away from said back surface of said PCB to form an angled surface with respect to said back surface, wherein said at least one light emitting element is on each of said angled surfaces; and
   conductors electrically connected with said PCB to provide an electrical signal to said at least one light emitting element, such that said at least one light emitting element emits light substantially away from said PCB.

17. The lighting unit of claim 16, wherein said at least one light emitting element is on said angled surface of said at least one tab, such that said angled surface is angled with respect to said back surface of said PCB.

18. The lighting unit of claim 16, wherein said at least one light emitting element is on said angled surface of said at least one tab, such that said angled surface is angled with respect to said front surface of said PCB.

19. A lighting unit, comprising:
   at least one printed circuit board (PCB) comprising a front surface, a back surface and at least one tab;
   at least one light emitting element on said front surface or said back surface of said PCB;
   said at least one tab adapted to be bent in a direction away from either of said front surface or said back surface of said PCB to form an angled surface with respect to the PCB, wherein said at least one light emitting element is on said angled surface; and
   conductors electrically connected with said PCB to provide an electrical signal to said at least one light emitting element, such that said at least one light emitting element emits light substantially away from said PCB, wherein said at least one PCB is comprised of two PCBs coupled to each other at their respective back surfaces, such that each of said two PCBs comprises said at least one light emitting element on said angled surface of said at least one tab, wherein said angled surface is angled with respect to said respective front surface of said respective PCB.

20. The lighting unit of claim 19, wherein said lighting unit is a double-sided lighting unit.

21. The lighting unit of claim 16, wherein said at least one PCB is capable of conducting and dissipating heat from said at least one light emitting element.

22. The lighting unit of claim 16, wherein said at least one tab is configured to be bent about a joint in order to form said angled surface, said joint disposed between said at least one tab and said PCB.

23. The lighting unit of claim 16, wherein said at least one tab is adapted to be set at an angle within the range of 0-90 degrees with respect to said PCB.

24. The lighting unit of claim 16, said at least one PCB further comprising a slot adapted to receive a mounting device to allow said lighting unit to be mounted onto a surface or other structure.

25. The lighting unit of claim 16, further comprising an optical element on said at least one PCB and proximate said at least one light emitting element to alter the light emitted from the at least one light emitting element.

26. The lighting unit of claim 25, wherein said optical element comprises at least one of a lens, diffuser, reflector, or a combination thereof.

27. The lighting unit of claim 16, further comprising a plurality of light emitting elements and a plurality of tabs, wherein each of said plurality of tabs comprises at least one light emitting element, wherein said angled surface of said plurality of tabs are angled with respect to either of said front surface or back surface of said PCB.

28. The lighting unit of claim 27, wherein two or more of said angled surfaces are all set at substantially the same angle.

29. The lighting unit of claim 27, wherein two or more of said angled surfaces are set at different angles.

* * * * *